United States Patent
Chiang et al.

[11] Patent Number: 6,037,257
[45] Date of Patent: Mar. 14, 2000

[54] SPUTTER DEPOSITION AND ANNEALING OF COPPER ALLOY METALLIZATION

[75] Inventors: Tony Chiang, Mountain View; Peijun Ding, San Jose; Barry Chin, Saratoga; Imran Hashim; Bingxi Sun, both of Sunnyvale, all of Calif.

[73] Assignee: Applied Materials, Inc., Santa Clara, Calif.

[21] Appl. No.: 08/853,191

[22] Filed: May 8, 1997

[51] Int. Cl.[7] ................ H01L 21/4763; H01L 21/44; H01L 23/48

[52] U.S. Cl. ............. 438/687; 438/660; 438/688; 438/637; 438/627; 438/648; 257/762; 257/765; 257/766; 257/771

[58] Field of Search ................... 438/687, 660, 438/688, 663, 643, 627, 653, 648, 657, 637; 257/762, 765, 766, 771

[56] References Cited

U.S. PATENT DOCUMENTS

| | | | |
|---|---|---|---|
| 5,391,517 | 2/1995 | Gelatos et al. | 438/687 |
| 5,654,232 | 8/1997 | Gardner | 438/686 |
| 5,744,394 | 4/1998 | Iguchi et al. | 438/687 |
| 5,747,360 | 5/1998 | Nulman | 437/189 |
| 5,770,519 | 6/1998 | Klein et al. | 438/687 |

FOREIGN PATENT DOCUMENTS

| | | |
|---|---|---|
| 508156 | 10/1992 | European Pat. Off. . |
| 703 598 A1 | 3/1996 | European Pat. Off. . |
| 725439 | 8/1996 | European Pat. Off. . |

OTHER PUBLICATIONS

Gutman et la., "Integration of copper multilevel interconnects with oxide and polymer interlevel dielectrics," *Thin Solid Films*, vol. 270, No. 1/2, Dec. 1995, pp. 472–479.

Murarka et al., "Copper interconnection schemes: Elimination of the need of diffusion barrier/adhesion promoter by the use of corrosion resistant, low resistivity doped copper," *Microelectronics Technology and Process Integration*, Austin TX, USA, Oct. 20–21, 1994, Proceedings of the SPIE—The International Society for Optical Engineering, vol. 2335, 1994, pp. 80–90.

Murarka et al., "Copper metallization for ULSI and beyond," *Critical Reviews in Solid State and Materials Science*, vol. 10, No. 2, 1995, pp. 87–124.

Lanford et al., "Low–temperature passivation of copper by doping with Al or Mg," *Thin Solid Films*, vol. 262, 1995, pp. 234–241.

*Primary Examiner*—John F. Niebling
*Assistant Examiner*—Ha Tran Nguyen
*Attorney, Agent, or Firm*—Charles S. Guenzer

[57] ABSTRACT

Copper and a small amount of an alloying metal such as magnesium or aluminum are cosputtered onto a substrate having oxide on at least a portion of its surface. Either the wafer is held at an elevated temperature during deposition or the sputtered film is annealed without the wafer being exposed to ambient. Due to the high temperature, the alloying metal diffuses to the surface. If a surface is exposed to a low partial pressure of oxygen or contacts silicon dioxide, the magnesium or aluminum forms a thin stable oxide. The alloying metal oxide encapsulates the copper layer to provide a barrier against copper migration, to form an adhesion layer over silicon dioxide, and to act as a seed layer for the later growth of copper, for example, by electroplating.

15 Claims, 4 Drawing Sheets

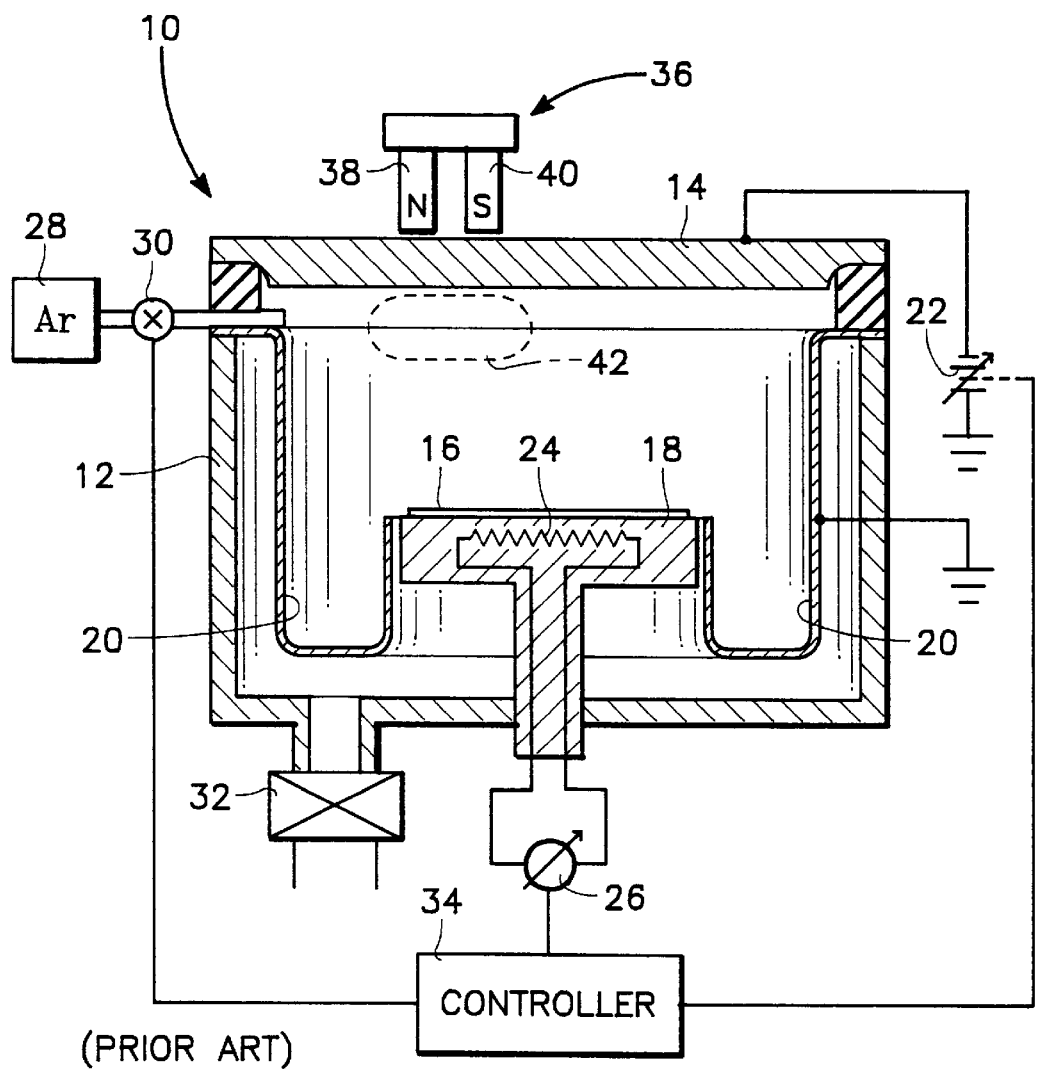
(PRIOR ART)
FIG. 1
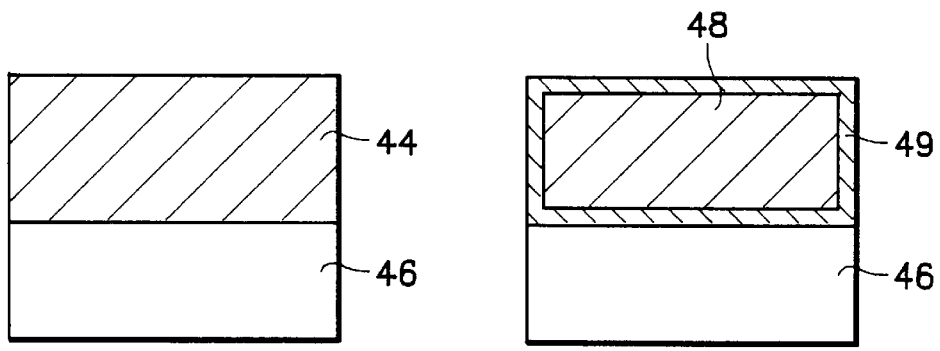
(PRIOR ART)
FIG. 2
(PRIOR ART)
FIG. 3

SPUTTER DEPOSITION AND ANNEALING OF COPPER ALLOY METALLIZATION

FIELD OF THE INVENTION

The invention relates generally to the fabrication of integrated circuits. In particular, the invention relates to the physical vapor deposition of copper.

BACKGROUND ART

A critical part of any advanced semiconductor integrated circuit involves the one or more metallization levels used to contact and interconnect the active semiconductor areas, themselves usually residing in a fairly well defined crystalline silicon substrate. Although it is possible to interconnect a few transistors or other semiconductor devices, such as memory capacitors, within or immediately on top of the semiconductor level, the increasingly complex topology of multiply connected devices soon necessitates another level of interconnect. Typically, an active silicon layer with transistors and capacitors formed therein is overlaid with a dielectric layer, for example, silicon dioxide. Contact holes are etched through the dielectric layer to particular contacting areas of the silicon devices. A metal is filled into the contact holes and is also deposited on top of the dielectric layer to form horizontal interconnects between the silicon contacts and other electrical points. Such a process is referred to as metallization.

A single level of metallization may suffice for simple integrated circuits of small capacity. However, dense memory chips and especially complex logic devices require additional levels of metallization since a single level does not provide the required level of interconnection between active areas. Additional metallization levels are achieved by depositing over the previous metallized horizontal interconnects another level of dielectric and repeating the process of etching holes, now called vias, through the dielectric, filling the vias and overlaying the added dielectric layer with a metal, and defining the metal above the added dielectric as an additional wiring layer. Very advanced logic device, for example, fifth-generation microprocessors, may have five or more levels of metallization.

Conventionally, the metallized layers have been composed of aluminum and aluminum-based alloys additionally comprising at most a few percent of alloying elements such as copper and silicon. The metallization deposition has typically been accomplished by physical vapor deposition (PVD), also known as sputtering. A conventional PVD reactor 10 is illustrated schematically in cross section in FIG. 1, and the illustration is based upon the Endura PVD Reactor available from Applied Materials, Inc. of Santa Clara, Calif. The reactor 10 includes a vacuum chamber 12 sealed to a PVD target 14 of the material to be sputter deposited on a wafer 16 held on a heater pedestal 18. A shield 20 held within the chamber protects the chamber wall 12 from the sputtered material and provides the anode grounding plane. A selectable DC power supply 22 biases the target negatively to about −600 VDC with respect to the shield 20. Conventionally, the pedestal 18 and hence the wafer is left electrically floating. The heater pedestal 18 includes a resistive heater 24 powered by an adjustable electrical power supply 26.

A gas source 26 of sputtering working gas, typically chemically inactive argon, supplies the argon to the chamber through a mass flow controller 28. A vacuum pump system 30 maintains the chamber at a low pressure. Although the base pressure can be in the range of about $10^{-7}$ to $10^{-8}$ Torr, the argon pressure is kept between 1 and 100 mTorr. A computer-based controller 34 controls the operation of the parts of the reactor including the DC power supply 22, the heater power supply 26, and the mass flow controller 30.

When the argon is admitted into the chamber, the DC voltage ignites the argon into a plasma, and the positively charged argon ions are attracted to the negatively charged target 14. The ions strike the target 14 at a substantial energy and cause target atoms or atom clusters to be sputtered from the target 14. Some of the target particles strike the wafer 16 and are thereby deposited on it.

To provide efficient sputtering, a magnetron 36 is positioned in back of the target. It has opposed magnets 38, 40 creating a magnetic field within the chamber in the neighborhood of the magnets 38, 40. The magnetic field traps electrons, and for charge neutrality, the ion density also increases to form a high-density plasma region 42 within the chamber adjacent to the magnetron 36. The high-density plasma increases the sputtering rate, and the magnetron 36 is scanned over the back of the target 14 to provide a more uniform sputtering process.

With the continuing miniaturization of integrated circuits, the demands upon the metallization have increased. Many now believe that aluminum metallization should be replaced by copper metallization. Murarka et al. provide a comprehensive review article on copper metallization in "Copper metallization for ULSI and beyond," *Critical Reviews in Solid State and Materials Science*, vol. 10, no. 2, 1995, pp. 87–124. Copper offers a number of advantages. Its bulk resistivity is considerably less than that of aluminum, 1.67 $\mu\Omega$-cm vs. 2.7 $\mu\Omega$-cm for pure material, and any reduction in resistivity offers significant advantages as the widths and thicknesses of the metallization interconnects continue to decrease. Furthermore, a continuing problem with aluminum metallization is the tendency of aluminum atoms in an aluminum metal to migrate along the metallization interconnects under high current densities, especially migrating away from hot spots, in a process called electromigration. Any excessive amount of such migration will break an aluminum interconnect and render inoperable the integrated circuit. Copper-based alloys exhibit significantly reduced levels of electromigration over aluminum and its alloys.

Thus, in many ways, the bulk behavior of copper is superior to that of aluminum, but two major problems have impeded its adoption in commercial circuits.

It has proven difficult to etch copper by a dry etch process, that is, by plasma etching. The etch problem seems to have been circumvented by the development of the damascene process in which a trench, perhaps with a via hole at its bottom, is etched into the silicon dioxide dielectric layer. The trench follows the intended path of the horizontal interconnect. A blanket deposition of copper fills the trench and additionally forms a layer over the dielectric. The wafer is then subjected to chemical mechanical polishing (CMP) to remove all copper exposed above the top of the trench and thus to leave a copper interconnect in the trench.

Another set of problems addressed by this invention involves the interfaces between the copper and other parts of the integrated circuit. A principal advantage of aluminum is its good interfacial characteristics. Aluminum forms a stable oxide layer, $Al_2O_3$, and it forms strong chemical bonds with silicon. Copper oxidizes, but the oxide is not stable and continues to grow over time upon exposure to a moist oxygen ambient. Copper and copper oxides do not adhere well to silicon dioxide. Finally, copper diffuses very quickly through silicon dioxide and can produce a short through or across the dielectric layer unless means are adopted to prevent the copper from entering the silicon dioxide. In the prior art, a separate barrier layer was deposited over the silicon dioxide before the copper was deposited to prevent the copper from diffusing into and through the oxide.

Murarka et al. in the aforecited review article recommend alloying copper with magnesium or aluminum to improve the interfacial qualities. Later work done by the Murarka group at Rensselaer Polytechnic Institute and their collaborators have developed a useful technique for forming dependable copper interconnects and provide a model for its operation. As Lanford et al. describe in "Low-temperature passivation of copper by doping with Al or Mg," *Thin Solid Films*, vol. 262, 1995, pp. 234–241, sputtering is used, as illustrated in the schematic cross section of FIG. 2, to deposit a film 44 of copper alloy on a substrate 46. Examples of the alloying element include aluminum and magnesium. The copper alloy film 44 can be deposited as alternating layers of copper and the alloying element, or the two constituents can be co-sputtered, for example, by use of a copper alloy sputtering target. After completion of the sputtering at near to room temperature, the wafer is annealed, for example, at 400° C. in argon for 30 minutes. As illustrated in the cross section of FIG. 3 the annealing causes a large fraction of the magnesium to diffuse to the outside of a remaining copper film 48 and to react with any oxygen present at the interfaces to form a film 49 of magnesium oxide. The MgO film 49 encapsulates the Mg-alloyed Cu body 44. The upper free surface of the copper film 48 is passivated by the MgO film 49. Magnesium oxide is a stable oxide and stops growing at a thickness in the range of 5 to 7 nm. The thin oxide is not believed to cause a high contact resistance, but in any case the oxide can be removed by a sputter etch prior to the deposition of a subsequent metallization. Lanford et al., ibid, suggest that the free surface is oxidized to MgO by oxygen impurities in the argon.

SUMMARY OF THE INVENTION

A metallization process and the resultant product in which a copper alloy comprising a few percent of an alloying element such as magnesium, aluminum, boron, and tantalum are sputtered onto a substrate containing an oxide surface portion, for example, silicon dioxide forming the walls of a via hole. Elevated temperature causes the alloying element to diffuse toward the oxide on the sidewalls and form a thin, stable alloying metal oxide that acts as a barrier against diffusion of the copper into and through the silicon oxide. If sufficient oxygen is present during the sputtering step, a metal oxide will form on the top surface of the copper alloy. Preferably, the copper alloy is sputtered onto the substrate while it is held at an elevated temperature sufficient to promote the alloying element diffusion during the sputtering.

BRIEF DESCRIPTION OF THE DRAWINGS

FIG. 1 is a schematic cross-sectional view of a conventional PVD reactor.

FIGS. 2 and 3 are cross sectional views illustrating the conventional encapsulation of a copper alloy body.

DETAILED DESCRIPTION OF THE PREFERRED EMBODIMENTS

The present invention includes a production-efficient process of forming a copper alloy film in which the sputter deposition of the alloy is closely associated with its anneal.

Figure 4:
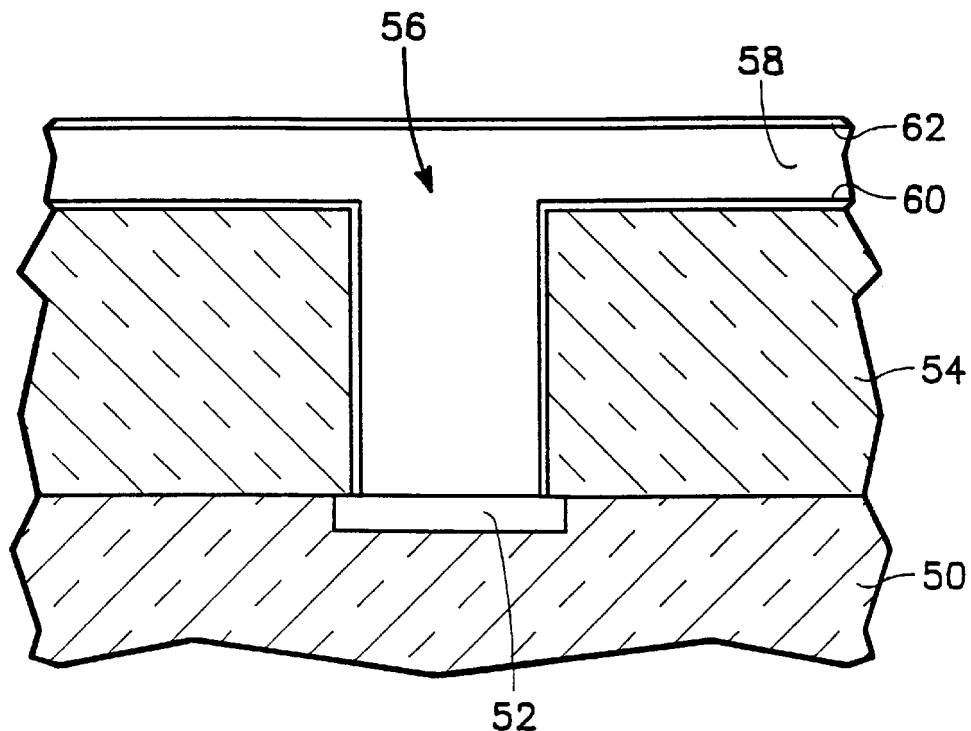
FIG. 4 a cross sectional view of a via filled with copper according to an embodiment of the invention.

A first embodiment of the invention, illustrated in cross section in FIG. 4, is an upper interlevel via. A lower level includes a lower interlevel dielectric layer 50, typically formed of silicon dioxide or silicate glass, that is, silicon oxide. A copper-based interconnect or pad 52 is formed in the upper surface of the lower dielectric layer 50. An upper level dielectric layer 54 of silicon dioxide or silicate glass is deposited over the lower dielectric layer 50, and a via hole 56 is etched through the upper dielectric layer 54 in the area of the copper pad 52. Physical vapor deposition (PVD) is then used to deposit a copper-alloy film 58 into the via hole 56 and on top of the upper dielectric layer 54. Both the copper and its alloying element, for example, magnesium, are sputtered at the same time so that a particle flux of uniform composition falls on the substrate. This co-sputtering is most easily accomplished by using a sputter target having a composition close to that of the desired copper alloy although some difference in composition may occur between the sputter target and the sputter deposited film because of differential sputtering yields between the two elements.

The copper alloy film 58 is either deposited at a relatively elevated temperature or is annealed after deposition so that the alloying element migrates to the surfaces to form a metal oxide diffusion layer 60 adjacent to the upper dielectric layer 54 and a metal oxide passivation layer 62 at the top, free surface. The oxygen for the metal oxides is supplied either by the silicon dioxide in the silica layer 54 or by residual oxygen in the argon or vacuum environment used for the sputtering or separate annealing step. Too high an oxygen partial pressure will oxidize the copper to form copper oxide since insufficient alloying element is diffusing to the surface to tie up the available oxygen. As will be shown later, the metal in the metal oxide diffusion layer 60 includes both the alloying element and some silicon while the metal in the metal oxide passivation layer 62 is primarily the alloying element. In the case of the alloying element being magnesium, both the metal oxide layers 60, 62 are composed at least in part of MgO, a stable oxide that forms to a thickness of about 7 nm under normal conditions and then stops growing. Such a thin oxide passivation layer 62 does not present significant electrical resistance in a direction perpendicular to the plane of the oxide layer. Note that no oxide layer forms adjacent to the first-level metal 52 because no significant amount of oxygen is available at that interface. No separate layer is illustrated because it is assumed that the alloying element freely diffuses into the first-level metal 52 at the same rate as it diffuses through the copper alloy film 56.

In one method of practicing the invention, the copper alloy is sputtered with the wafer held at an elevated temperature sufficient to anneal the copper alloy as it is being sputter deposited. That is, it is a hot sputter deposition. Preferred temperatures are described later. As illustrated in FIG. 1, the Endura PVD reactor includes a heater 24 in its wafer pedestal 18 capable of providing the temperatures required for the invention. In the case of hot sputter deposition, although a uniform copper alloy is being deposited, the alloying element diffuses outwardly and forms an inner oxide layer 60 next to the silicon dioxide dielectric layer 54 and an outer oxide layer 62. Because no oxygen is readily available at the top of the copper pad 22, no inner oxide layer is formed over the copper pad 22. An advantage of the real-time annealing is that the initially deposited copper alloy immediately reacts with the silicon oxide to form a combined oxide of silicon and the alloying element. This interface provides much better adhesion for later deposited copper or copper alloy than is available from the combination of copper and silicon oxide.

In a second general method of performing the invention, the copper alloy film 58 is PVD deposited at lower temperatures, for example, room temperature, at which no significant annealing or diffusion of the alloying element occurs. After the copper alloy deposition, the wafer is annealed. The annealing can be performed in situ in the PVD chamber in which the copper alloy film has been deposited or in a separate annealing furnace, and the annealing ambient can be a vacuum or a purge gas such as argon. The post-deposition annealing can be performed within the same PVD chamber in which the copper alloy film was deposited if the heater pedestal is capable of providing the somewhat higher temperatures required for a post-anneal. Alternatively, the wafer can be moved to a separate annealing chamber for an ex situ anneal. However, the transfer to the annealing chamber needs to be performed within a controlled environment that is essentially oxygen free, for example, $10^{-9}$ Torr. The Endura cluster tool from Applied Materials can be used for a vacuum transfer.

Murarka demonstrates the differences between annealing and high-temperature oxidation in "Use of advantageous impurity effects in metallization," *Materials Research Society Symposium Proceedings*, vol. 405, pp. 485–496, 1996. When an otherwise untreated CuAl alloy film was heated to 300° C. in air, a copper oxide layer forms and grows to about 70 nm over 20 hours. That is, the CuAl film oxidized. On the other hand, when the CuAl film was annealed in an argon ambient for 30 minutes at 400° C., subsequent annealing as described immediately above did not produce a measurable copper oxide layer. That is, the initial anneal in a reduced oxygen environment prevents subsequent oxidation.

A number of experiments were performed using the copper alloy metallurgy but in a planar configuration. The first two experiments concentrated on the metal oxide barrier layer 60, and no effect of the metal oxide passivation layer 62 is seen.

Experiment 1

In a first series of experiments, a planar copper metallization of various forms was formed over a 100 nm-thick layer of silicon dioxide over a conducting silicon substrate, and a metal contact was applied to the copper metallization. An additional contact was applied to the conductive substrate. The samples were then electrically stressed by applying a potential of 2 MV/cm across the oxide layer with the sample held at 275° C. The leakage current was monitored as a function of time. At some point, sufficient copper diffused across the oxide to cause it to be a reasonably good conductor. A threshold current was considered to represent a failure. A sufficient number of samples were measured to calculate a mean time to failure (MTTF).

For the inventive samples, the copper alloy was Cu with 2 atomic % of Mg sputter deposited to a thickness of about 200 nm. The results for three types of preparations are shown in TABLE 1, together with one comparative sample.

TABLE 1

| Barrier | Deposition/Anneal | MTTF (hours) | Min MTTF (hours) | Max MTTF (hours) |
|---|---|---|---|---|
| CuMg | RT deposition; anneal @ 350 C., 10 min. | 2.2 | 0.12 | 8.19 |
| CuMg | Deposition @ 250 C.; 5 min. hold | 3.1 | 0.10 | 7.80 |
| CuMg | Deposition @ 150 C.; 5 min. hold | 3.2 | 1.3 | 5.6 |
| Cu only | | <0.1 | | |

In the first inventive sample, the CuMg alloy was sputter deposited at close to room temperature and was then annealed for 10 minutes at 350° C. in 1mTorr of argon. The MTTF was reasonably large, but the range of MTTF values extended to undesirably short times. In the second inventive sample, the CuMg was sputter deposited with the wafer held at 250° C., and the wafer temperature was held for 5 minutes after completion of sputtering. The MTTF increased, but the range was still too wide. In the third inventive sample, the CuMg was instead sputter deposited at 150° C. with the same post-sputter hold. The MTTF was good, and the range was substantially narrowed. However, the statistics are too meager to reach definite conclusions, and the three processes should be considered at this time to produce comparable results. These values compare to the last entry for a comparative sample in which a copper film had no substantial amount of alloying, and no barrier was formed between the copper and the oxide. The MTTF was too short to measure.

Experiment 2

Figure 5:
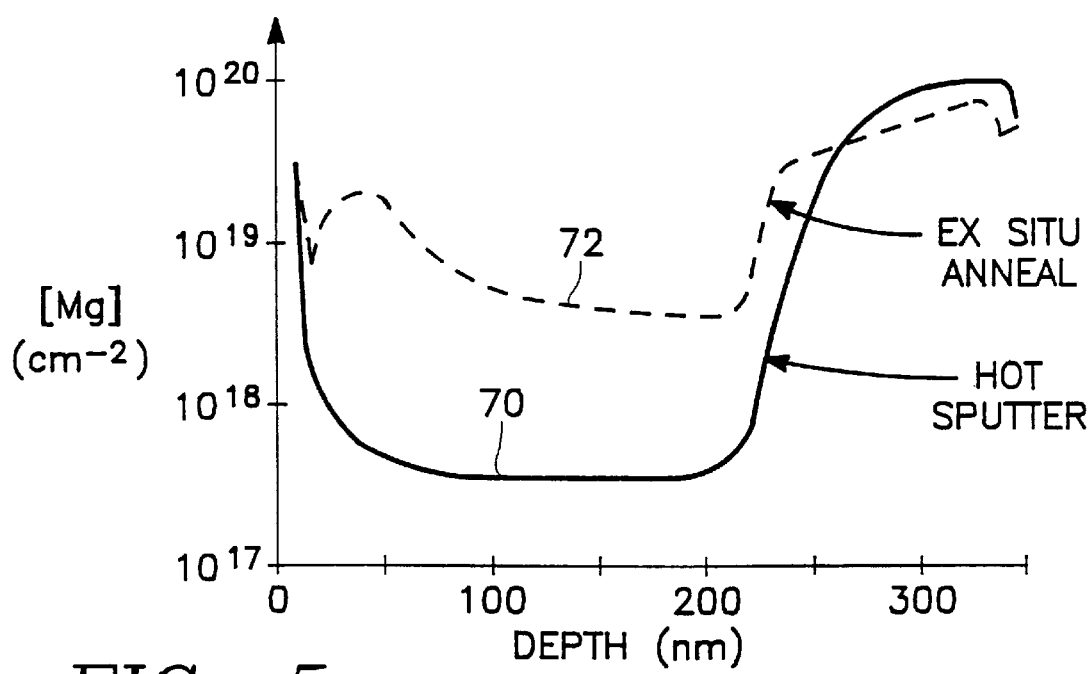
FIGS. 5 and 6 are graphs of the atomic profiles of Mg and O across the copper alloy films of the invention.
Figure 6:
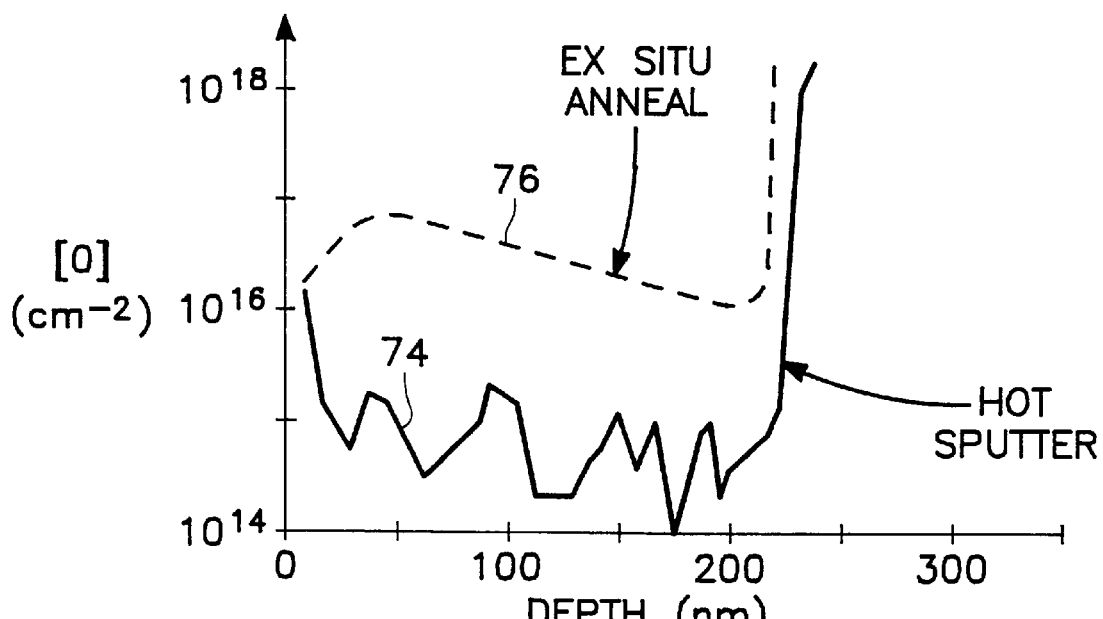

The atomic profiles were measured on inventive planar samples prepared similarly to those described above. The profiling was performed with secondary ion mass spectroscopy. The atomic concentrations of magnesium are shown in FIG. 5. Curve 70 gives the profile for a sample sputter deposited at 250° C. with Cu and 2 atomic % Mg with no separate, elevated-temperature annealing step. Curve 72 gives the profile for a sample sputter deposited at less than 50° C. which was then annealed at 350° C. Both samples show a definite diffusion of the Mg to the free surface and toward the silicon oxide underlayment. The Mg then diffuses into the silicon oxide, but the concentration falls off after about 100 nm. However, the hot deposited copper alloy shows greater depletion of the Mg in the principal portion of the Cu, which would provide reduced electrical resistance. The atomic concentrations of oxygen are shown in FIG. 6. Curve 74 gives the profile for a hot sputtered sample deposited at 350° C. with no annealing while curve 76 gives the profile for the previously described cold sputtered sample with ex situ annealing. A 7 nm surface oxide layer is too thin to be accurately measured by this technique. The hot deposited sample has substantially reduced oxygen concentration in the bulk of the copper, clearly advantageous for reduced electrical resistance.

Thus, the hot sputter has the advantages of eliminating a separate annealing step and of decreasing the amounts of the alloying element and of the oxygen impurities in the remaining copper film.

Experiment 3

Some of the same samples used in the profiles of FIGS. 5 and 6 were measured for their resistivity as a function of deposition and annealing temperatures, and these results provide another basis for optimizing treatment temperatures.

Two sets of samples were PVD deposited with the Cu alloy having 2 atomic % Mg with the wafers being held nominally at room temperature. One set of samples were then annealed ex situ at 350° C. in a vacuum environment, that is, an ex situ anneal. The resistivity of the CuMg film was measured as a function of the length of this anneal. The 350° C. results are shown by curve 80 in FIG. 7. Another set of samples were annealed at 450° C., and these results are shown by curve 82. For interconnects, the resistivity should be minimized. These results suggest a minimum post-annealing temperature of 350° C. for about 10 minutes in order to minimize the thermal budget.

In a related experiment, three more sets of samples were PVD deposited with CuMg alloy at an elevated deposition temperature. After cessation of sputter deposition, the samples were held at the deposition temperature for a varied time. The results for 175° C. sputtering are shown by line 84 in FIG. 8; for 250° C. sputtering, by line 86; and for 350° C. sputtering, by line 88. These results show that hold time has little effect; that is, the in situ annealing during deposition is sufficient to achieve low resistivity. These results also show that the sputtering temperature should be a minimum of 250° C. to achieve minimum resistivity at minimum thermal budget It is anticipated that an optimum temperature range for in situ annealing is 200 to 300° C. However, the results of TABLE 1 indicate that the diffusion barrier characteristic is improved at an even lower deposition temperature of 150° C. Although resistivity data is not available at this temperature, the trend of FIG. 8 indicates an acceptable resistivity at this temperature. Hence, resistivity can be traded against the diffusion resistance.

Figure 7:
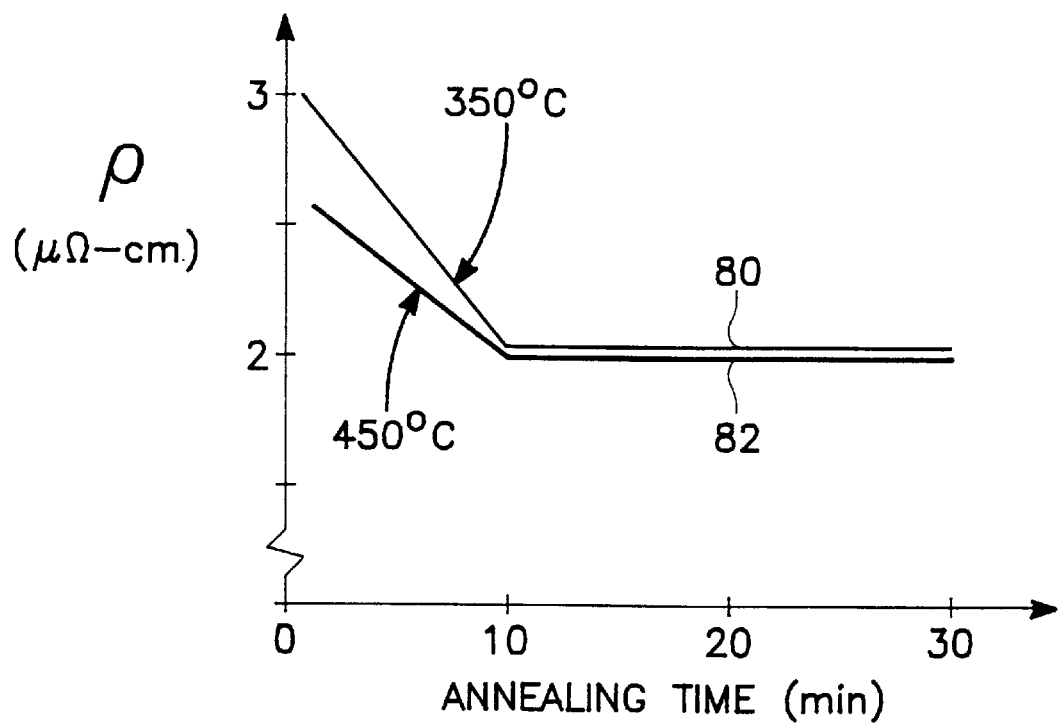
FIG. 7 is a graph of the resistivity as a function of annealing time for a CuMg alloy that was deposited cold and then annealed at the indicated temperatures.
Figure 8:
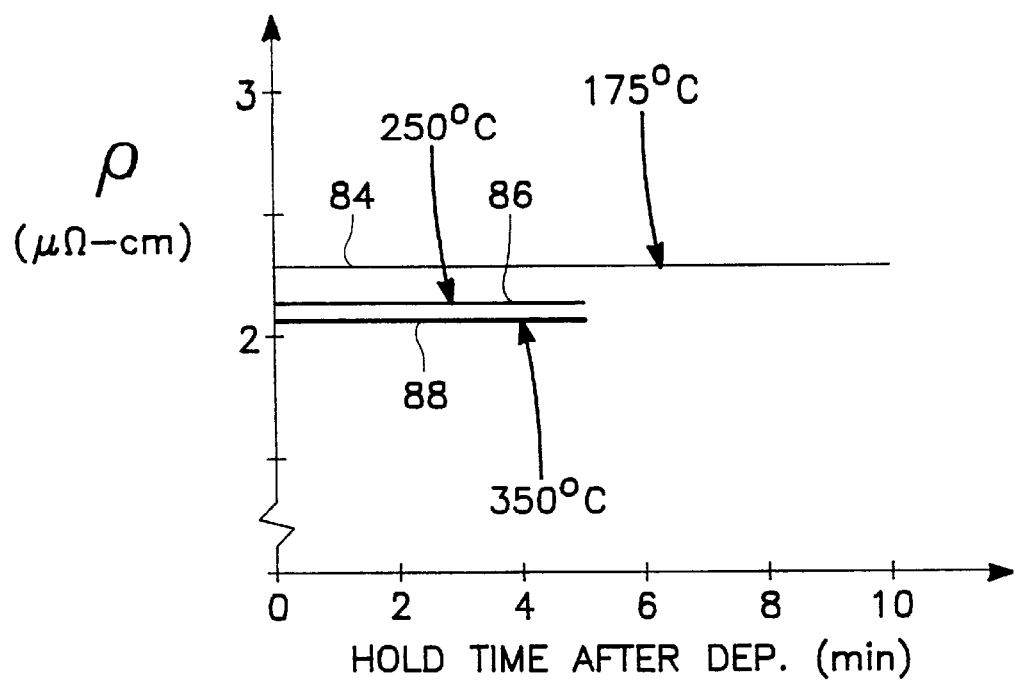
FIG. 8 is a graph of the resistivity as a function of hold time for a CuMg alloy that was deposited at the indicated temperatures and then held at that temperature.

Comparing the results of FIGS. 7 and 8, both the ex situ and in situ anneal are capable of producing nearly the same low value of resistivity. However, the thermal budget is minimized with the real-time in situ anneal of FIG. 8.

Figure 9:
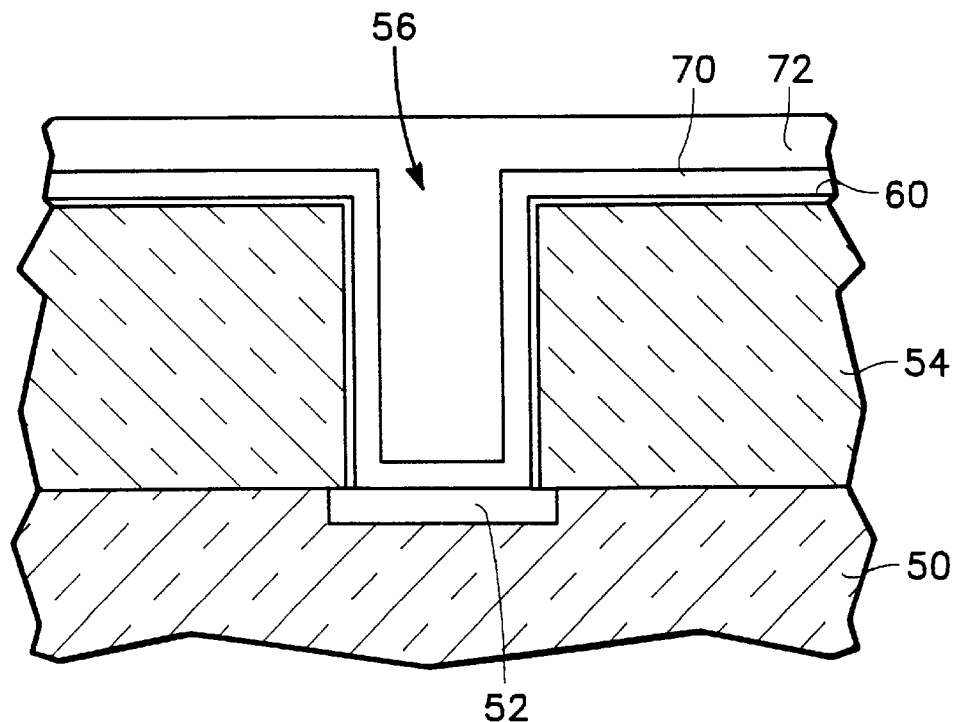
FIG. 9 is a cross section view of a via filled with copper according to a second embodiment of the invention.

The structure illustrated in FIG. 4 assumed that a uniform copper alloy film 58 completely fills the via hole 56. However, many of the benefits of the invention can be obtained with a very thin copper alloy film of less than 50 nm thickness. Even a thickness 5 nm seems sufficient. As illustrated in the cross-sectional view of FIG. 9, a conformal film 70 of the copper alloy is deposited into the via hole 56 and on top of the second dielectric oxide layer 54. The conformality of the copper alloy film 70 in a narrow and deep via requires special techniques such as HDP, long throw, or collimation. Fu et al. have disclosed an alternate technique in U.S. patent application, Ser. No. 08/854,008 filed May 8, 1997. In their technique, which is particularly applicable to copper sputtering, an anode grid is inserted between the target and the substrate to allow sustained self-sputtering and to provide a more directional sputter deposition.

Either a hot sputtering process or a post anneal will cause the alloying element in the conformal copper alloy film 60 to diffuse to the dielectric oxide layer 54 and form the previously described metal oxide barrier layer 60. A separate deposition process deposits a copper layer 72, which fills the via hole 56 and overlies the upper dielectric layer 54. No alloying element is required in the copper layer 72 since the barrier layer 60 is formed from the alloying element in the copper alloy film 70. The hole filling may be performed by many processes including PVD, CVD, or electro or electroless plating. Murarka describes electroless plating of copper in his previously cited article in *Critical Reviews*. The copper layer 72 more readily fills the via hole coated with the copper alloy film 60 so the second copper deposition does not require special hole filling techniques. As mentioned before, the annealed copper alloy layer, particularly when hot deposited, provides a good adhesion layer to the silicon oxide.

Experiment 4

A series of samples were tested for corrosion resistance. The samples of the previously described copper magnesium alloy, after fabrication as described below, were annealed in an oven at 150° C. with air ambient for about 30 minutes. After annealing, the samples were visually inspected for surface corrosion. The results are shown in TABLE 2.

TABLE 2

| Process | Anneal/Dep Temperature (° C.) | Hold/Anneal Time (minutes) | Color |
| --- | --- | --- | --- |
| ex situ anneal | 500 | 30 | partially brown |
| hot sputter | 200 | 5 | blue |
| hot sputter | 300 | 5 | blue |
| hot sputter | 400 | 0 | partially brown |
| hot sputter | 400 | 10 | OK |

The first sample was sputtered at room temperature and then annealed at 500° C. in a separate ex situ anneal. Its surface was partially brown indicating some copper oxidation. The second and third samples were hot sputtered at 200 and 300° C. respectively and held at those temperatures for 5 minutes. Both had a blue appearance, indicating partial copper oxidation. The fourth sample was hot sputtered at 400° C. with no post-deposition hold. The partially brown color indicated copper oxidation. The last sample was hot sputtered at 400° C. and held at that temperature for 10 minutes after sputtering. No color change was apparent.

These results indicate that to minimize surface corrosion, hot sputtering is preferred, and the hot sputtering should be performed at above 300° C. and preferably at 400° C. and above with a significant post-deposition hold. Thus, considerations of surface corrosion indicate a higher hot-sputtering temperature and a longer hold than do considerations of barrier properties. Also, an ex situ anneal does not seem to produce satisfactorily low surface corrosion. Of course, surface oxide can be removed by a sputter pre-etch prior to a subsequent deposition.

The invention is not limited to the described copper alloys. Generally, the atomic alloying percentages will range up to 10 atomic %. However, it is now generally believed that the Mg alloying should be kept below 6 atomic % and the Al alloying should be kept below 0.3 atomic % although thin layers will require a higher alloying concentration. A minimum alloying percentage is 0.05 atomic %. Other metal alloying elements, such as tantalum and boron, can be used which form stable oxides and readily diffuse through copper.

The invention thus provides a self-generating barrier between a copper metallization and an oxide layer, and no separate barrier deposition is required. For the hot sputter deposition, no additional annealing is required. The copper metallization and associated barrier may be used for filling via structures or as a thin barrier layer.

What is claimed is:

1. A method of depositing a copper-based metal into an aperture, comprising the steps of:

forming a hole through an oxide dielectric layer to an underlying conductive layer;

sputtering an alloy comprising at least 90 atomic % copper and less than 10 atomic % of an alloying element into said hole to form an alloy film; and then annealing said alloy film for no more than 10 minutes at an elevated temperature sufficient to cause said alloying element to diffuse toward said dielectric layer and to form a metal oxide of said alloying element.

2. The method of claim 1, wherein said oxide dielectric layer comprises silicon and oxygen.

3. The method of claim 2, wherein said alloying element is chosen from the group consisting of magnesium, aluminum, tantalum, and boron.

4. The method of claim 3, wherein said alloying element is magnesium and said alloy comprises 2 atomic % or less of magnesium.

5. The method of claim 3, wherein said alloying element is aluminum and said alloy comprises 0.5 atomic % or less of aluminum.

6. The method of claim 1, wherein said elevated temperature is at least 350° C.

7. The method of claim 6, wherein said elevated temperature is no more than 450° C.

8. A method of depositing a copper-based metal into an aperture, comprising the steps of:

forming a hole through an oxide dielectric layer to an underlying conductive layer in a substrate;

sputtering an alloy comprising at least 90 atomic % copper and less than 10 atomic % of an alloying element into said hole while said substrate is held at a sputtering temperature of between 150 to 300° C. to form an alloy film; and then annealing said substrate at an annealing temperature of at least 150° C. for between 5 and 10 minutes.

9. The method of claim 8, wherein said oxide dielectric layer comprises silicon and oxygen.

10. The method of claim 9, wherein said alloying element is chosen from the group consisting of magnesium, aluminum, tantalum, and boron.

11. The method of claim 10, wherein said alloying element is magnesium and said alloy comprises 2 atomic % or less of magnesium.

12. The method of claim 10, wherein said alloying element is aluminum and said alloy comprises 0.5 atomic % or less of aluminum.

13. The method of claim 8, wherein said annealing temperature is no more than said sputtering temperature.

14. The method of claim 8, wherein said sputtering and annealing temperatures are no more than 250° C.

15. The method of claim 14, wherein said sputtering and annealing temperatures are no more than 150° C.

* * * * *